United States Patent
Boersma et al.

(10) Patent No.: US 8,032,854 B2
(45) Date of Patent: Oct. 4, 2011

(54) 3-STACK FLOORPLAN FOR FLOATING POINT UNIT

(75) Inventors: Maarten Boersma, Holzgerlingen (DE); Michael Kroener, Ehningen (DE); Petra Leber, Ehningen (DE); Silvia M. Mueller, Altdorf (DE); Jochen Preiss, Boeblingen (DE); Kerstin Schelm, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 12/201,092

(22) Filed: Aug. 29, 2008

(65) Prior Publication Data

US 2010/0058266 A1    Mar. 4, 2010

(51) Int. Cl.
*G06F 17/50* (2006.01)

(52) U.S. Cl. .................. 716/119; 716/118

(58) Field of Classification Search .......... 716/118, 716/119
See application file for complete search history.

(56) References Cited

U.S. PATENT DOCUMENTS

| | | | | |
|---|---|---|---|---|
| 6,275,838 B1 * | 8/2001 | Blomgren et al. | ........... | 708/501 |
| 7,058,830 B2 * | 6/2006 | Dhong et al. | ........... | 713/320 |
| 7,461,117 B2 * | 12/2008 | Trong et al. | ........... | 708/501 |

OTHER PUBLICATIONS

E. Schwarz, "Binary Floating-Point Unit Design: the Fused Multiply-Add Dataflow," High Performance Energy-Efficient Microprocessor Design, 2006, pp. 189-208, Springer Verlag, New York.

Y-H. Chan, et al., "4GHz+ Low-Latency Fixed-Point and Binary Floating-Point Execution Units for the POWER6 Processor," Solid-State Circuits Conference, ISSCC, Digest of Technical Papers, 2006, pp. 1728-1734, IEEE International, China.

S.R. Carlough, et al., "IBM POWER6 Accelerators: VMX and DFU," IBM Journal of Research and Development, Nov. 2007, pp. 663-684, vol. 51 No. 6, International Business Machines Corporation, New York.

M. Kroener et al., "P6 Binary Floating-Point Unit," [online]; [retrieved on Aug. 15, 2008]; retrieved from the Internet http://www.lirmm.fr/arith18/papers/daotrongs-1-p6bfu.pdf.

* cited by examiner

*Primary Examiner* — Jack Chiang
*Assistant Examiner* — Brandon Bowers
(74) *Attorney, Agent, or Firm* — Cantor Colburn LLP; Matthew Talpis

(57) ABSTRACT

A 3-stack floorplan for a floating point unit includes: an aligner located in the center of the floating point unit; a frontend located directly above the aligner; a multiplier located directly below the frontend and next to the aligner; an adder located directly next to the multiplier and directly below the aligner; a normalizer located directly above the adder; and a rounder located directly above the normalizer.

8 Claims, 5 Drawing Sheets

3-STACK FLOORPLAN FOR FLOATING POINT UNIT

This invention was made with Government support under Contract No.: HR0011-07-9-0002 awarded by DARPA. The Government has certain rights in this invention.

BACKGROUND

This disclosure relates generally to the field of computer hardware design, and more specifically to a floorplan of a floating point unit.

A floating point unit (FPU) is a part of a computer system designed to carry out operations on floating point numbers. Operations may include addition, subtraction, multiplication, fused multiplication and addition, fused multiplication and subtraction, division, square root, and/or exponential or trigonometric calculations. A FPU may comprise a plurality of functional blocks, including but not limited to a frontend, an aligner, a multiplier, an adder, a normalizer, and a rounder. The speed of the FPU may significantly affect the speed of the computer system as a whole, and the speed of the FPU is determined in part by the physical layout, or floorplan, of the functional blocks.

Optimizing a high-frequency FPU floorplan for speed and size presents various challenges, such as minimizing wire delay between functional blocks (i.e., minimizing the length of time it takes for a signal to propagate from one block to another) and avoiding wire congestion. Functional blocks may be connected by default wires or by good wires. The width of a default wire is the minimum wire width suitable for technology. A good wire has a width which is an integer multiple of the width of a default wire. Signals may take a whole cycle to propagate from one corner of the FPU to the opposite corner on a default wire; a good wire provides a significantly faster connection. However, a default wire is smaller and consumes less power than a good wire. Paths between the major functional blocks of the FPU may require good wires to maximize speed of operation of the FPU, but the number and length of good wires that may be used in the FPU floorplan is limited, due to wire congestion and space constraints. Also, longer wires of either type may require buffering, while shorter wires may not; therefore, shorter wires are desirable when possible.

There is therefore a need for an optimized floorplan for a FPU, and a method of making an FPU with an optimized floorplan.

BRIEF SUMMARY

An exemplary embodiment of a 3-stack floorplan for a floating point unit includes: an aligner located in the center of the floating point unit; a frontend located directly above the aligner; a multiplier located directly below the frontend and next to the aligner; an adder located directly next to the multiplier and directly below the aligner; a normalizer located directly above the adder; and a rounder located directly above the normalizer.

An exemplary embodiment of a method of making a floating point unit includes: placing an aligner in the center of the floating point unit; placing a frontend directly above the aligner; placing a multiplier directly below the frontend and directly next to the aligner; placing an adder directly next to the multiplier and directly below the aligner; placing a normalizer directly above the adder; and placing a rounder directly above the normalizer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of an apparatus and method for a 3-stack FPU are provided, with exemplary embodiments being discussed below in detail.

Figure 1:
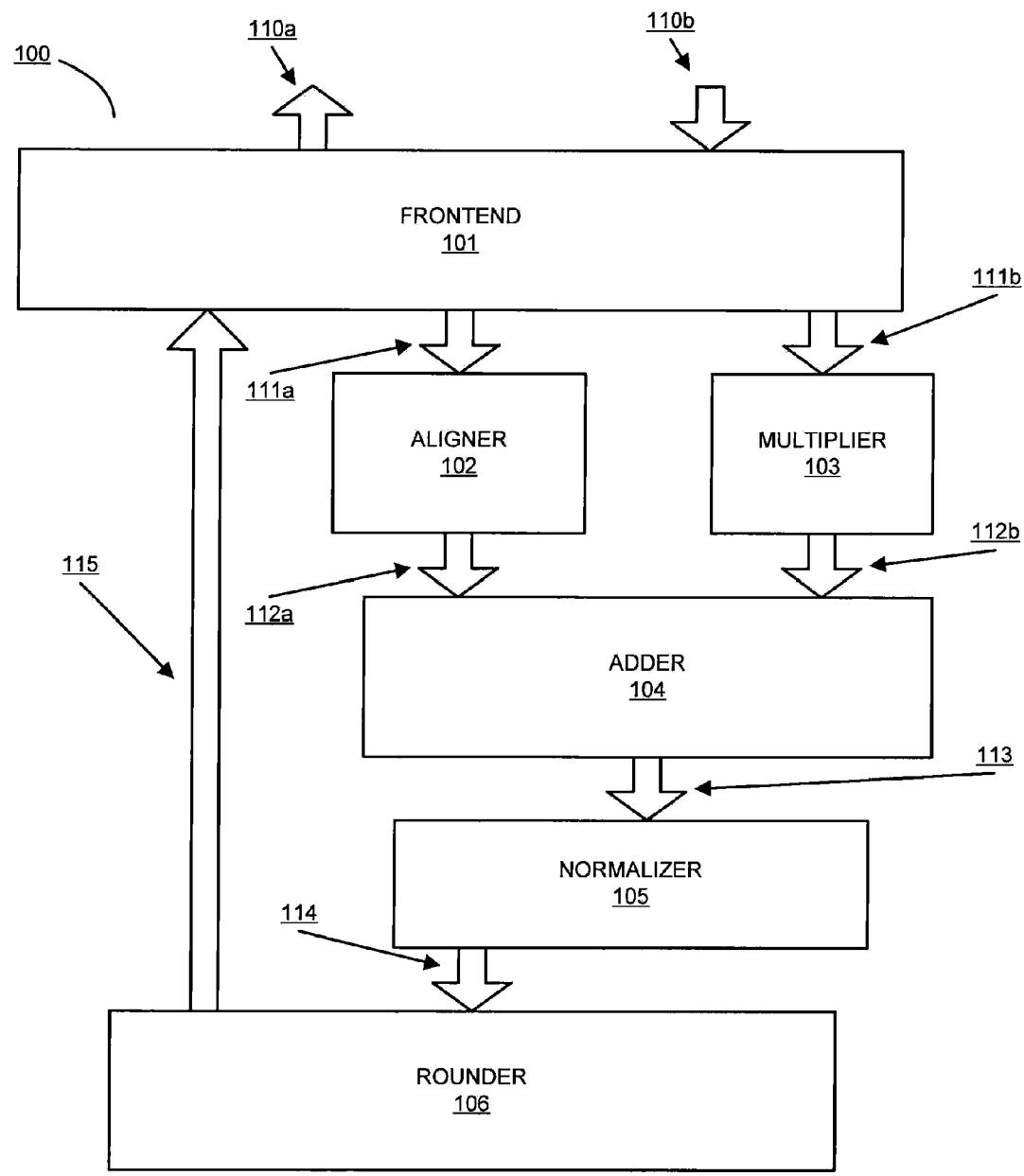
FIG. 1 illustrates a flowchart of a datapath of a floating point unit.

A flowchart 100 of a datapath of a FPU is illustrated in FIG. 1. Input from a computer system (not shown) enters frontend 101 at input 110b. From frontend 101, flow then proceeds through two parallel paths, one through path 111a to aligner 102, and one through path 111b to multiplier 103. Path 112a goes from aligner 102 to adder 104, and path 112b goes from multiplier 103 to adder 104. From adder 104 there is a single path 113 to normalizer 105, and another single path 114 from normalizer 105 to rounder 106. The result from rounder 106 is then forwarded to frontend 101 via path 115. The result is received at frontend 101, and may be output to the computer system (not shown) at output 110a. Alternatively, in some embodiments, the result may be output to the computer system directly from the rounder, in which case path 110a may connect to rounder 106 instead of frontend 101.

Each of paths 111a, 111b, 112a, 112b, 113, 114, and 115 requires a fast connection in order to maximize operational speed of the FPU. Further, the multiplier 103 and aligner 102 are relatively large, wire-intensive functions, so routing path wires over either the multiplier 103 or aligner 102 may lead to wire congestion.

Figure 2:
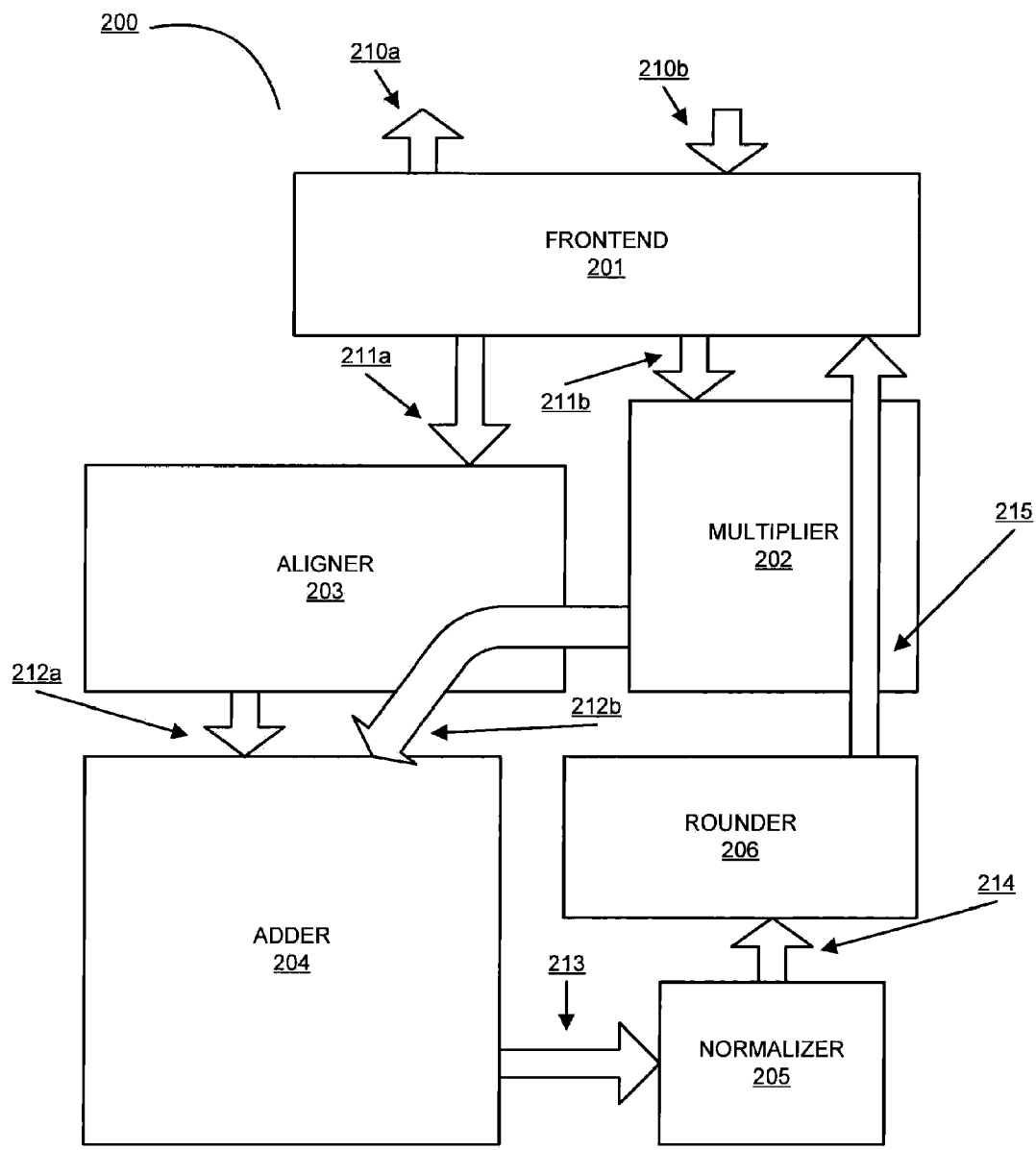
FIG. 2 illustrates a prior art 2-stack floating point unit.

A prior art 2-stack FPU floorplan 200 is shown in FIG. 2. The first vertical stack comprises frontend 201, multiplier 202, rounder 206, and normalizer 205. The second vertical stack comprises aligner 203 and adder 204. As seen in FIG. 2, frontend 201 receives input from a computer system (not shown) at input bus 210b. Frontend 201 is connected to multiplier 202 via bus 211b, and to aligner 203 via bus 211a. Multiplier 202 is connected to adder 204 via bus 212b; bus 212b crosses over aligner 203. Aligner 203 is connected to adder 204 via bus 212a. The adder 204 is connected to normalizer 205 via bus 213, and normalizer 205 is connected to rounder 206 via bus 214. Bus 215, from rounder 206 to frontend 201, crosses over multiplier 202. The result from bus 215 is latched at frontend 201 and output to the computer system (not shown) at output bus 210a. Bus 215 may use good wires in some embodiments. Bus 215 is relatively long, which may slow down operation of the FPU, even if bus 215 uses a good wire. As the multiplier 202 comprises a large number of wires, use of good wires for bus 215 may cause wire congestion over multiplier 202. Also, bus 215 is not suitable for fast reuse of the FPU result by the FPU itself. To send the FPU result back to the computer system, the result travels from rounder 206 through the frontend 201 back into the computer system 208 via bus 215 and bus 210a; this may have a relatively long propagation time. The above factors may limit the overall FPU performance in the computer system. Bus 212b may also cause wire congestion over aligner 203; aligner 203 may comprise a shifter, which may comprise a large amount of horizontal wire.

Figure 3:
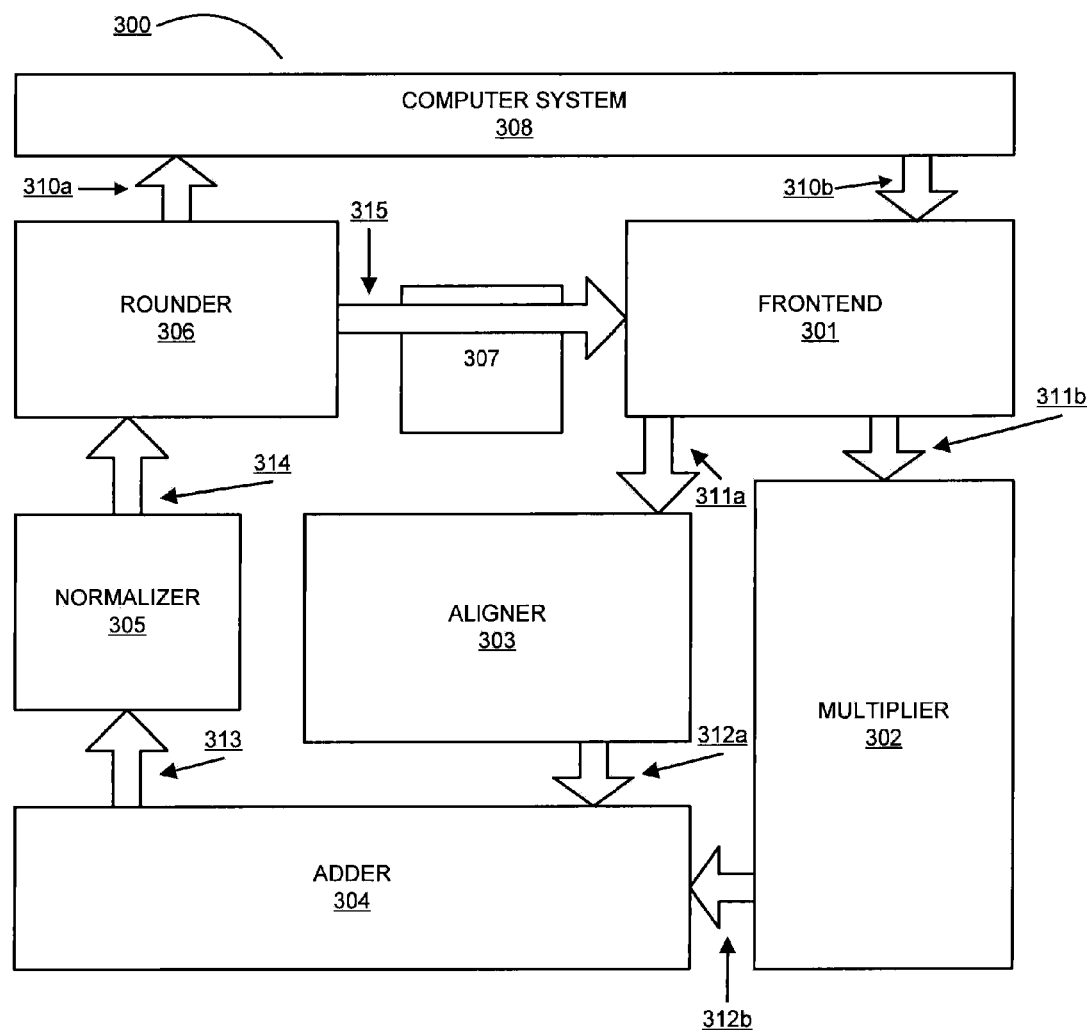
FIG. 3 illustrates an embodiment of a 3-stack floating point unit.

An embodiment of a 3-stack FPU floorplan 300 is shown in FIG. 3. FPU floorplan 300 is a 2-dimensional floorplan. The first vertical stack comprises frontend 301 and multiplier 302. The second stack comprises aligner 303 and adder 304. The third stack comprises normalizer 305 and rounder 306. As seen in FIG. 3, frontend 301 receives input from a computer system 308 (shown in more detail in FIG. 5, below) at input 310b. Frontend 301 is located directly above multiplier 302, and is connected to multiplier 302 via bus 311b and aligner 303 via bus 311a. Aligner 303 and multiplier 302 are located directly next to each other. Multiplier 302 is connected to adder 304 via bus 312b, and aligner 303 is connected to adder 304 via bus 312a. Adder 304 is located directly next to multiplier 302 and directly below aligner 303. Adder 304 is connected to normalizer 305 via bus 313; normalizer 305 is located directly above adder 304. Normalizer 305 is connected to rounder 306 via bus 314; rounder 306 is located directly above normalizer 305. Rounder 306 may also be vertically aligned with frontend 301 in some embodiments. The result from rounder 306 travels via bus 315 to frontend 301. The result is output to computer system 308 directly from rounder 306 via output 310a. In some embodiments, an exponent/control block 307 is located between frontend 301 and rounder 306. Input 310b and output 310a may comprise global operand buses in some embodiments, and frontend 301 may comprise operand latches in some embodiments. Blocks with critical input/output (I/O) to the computer system 308, including rounder 306 and frontend 301, are located close to the sink/source, at the top of the FPU.

In some embodiments, the relative size of the components of FIG. 3 may be as follows. The multiplier 302 may be designed to have a height that is approximately the sum of the heights of aligner 303 and adder 304. The adder 304 may be designed to have a width that is approximately the sum of the widths of the aligner 303 and normalizer 305.

As can be seen in the embodiment of FIG. 3, buses 311a, 311b, 312a, 312b, 313, 314, and 315 are all relatively short and do not cross over any major functional blocks, allowing for use of good wires in some embodiments without causing wire congestion. Embodiments using short good wires reduce power consumption while speeding up operation of the FPU. Use of a relatively short bus for bus 315 also allows for fast reuse of the FPU result by the FPU itself. Since rounder 306 is located close to the top of the FPU, the result is sent back directly to the computer system 308. This improves the overall FPU performance in the computer system. In some embodiments, bus 315 may cross over exponent and control block 307; as the exponent and control block is not a wire-intensive block, good wires may be used for bus 315 in such an embodiment without causing wire congestion.

Figure 4:
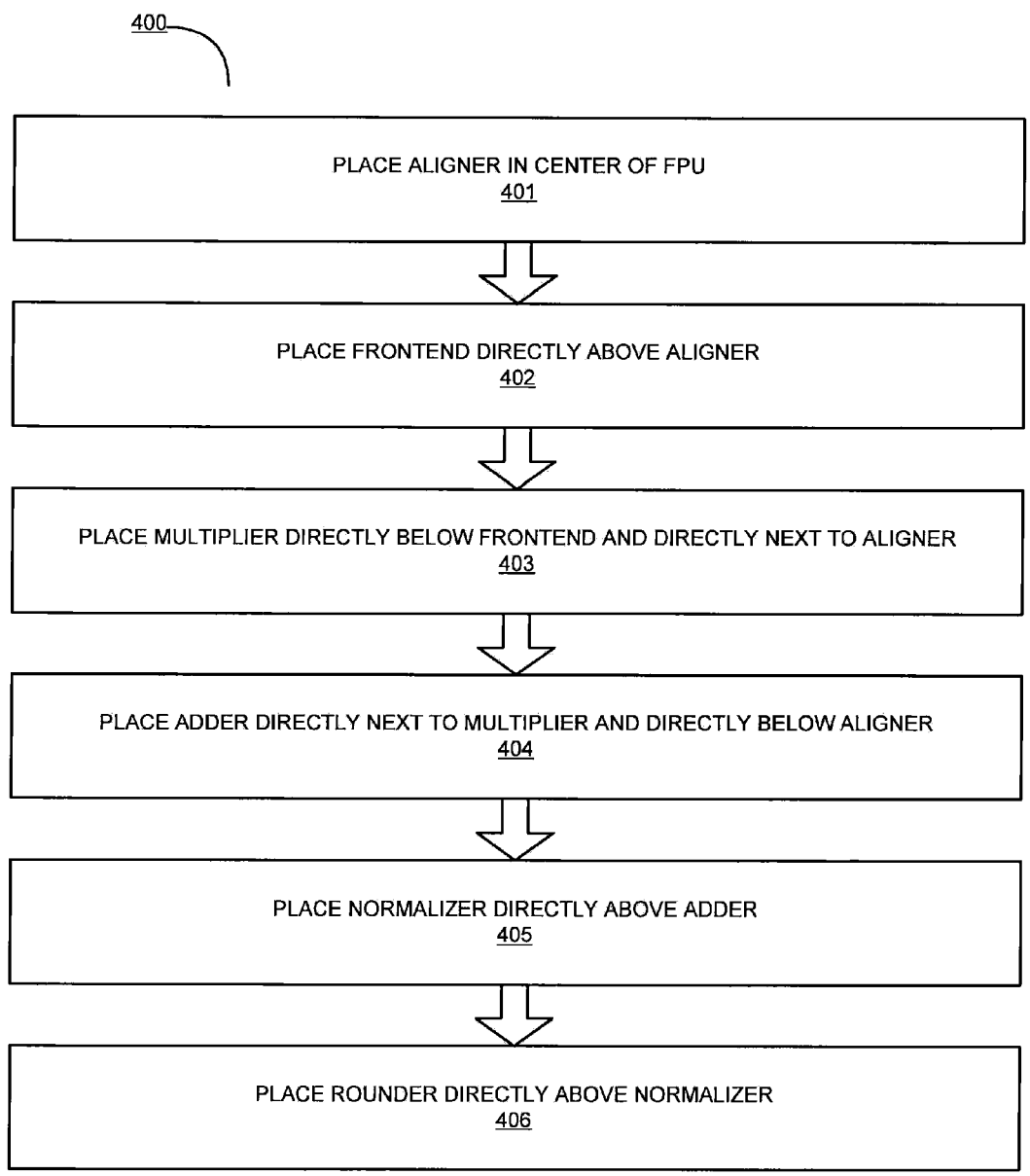
FIG. 4 illustrates an embodiment of a method of making a 3-stack floating point unit.

FIG. 4 shows an embodiment of a method 400 for obtaining a 3-stack floating point unit. First, in block 401, the aligner is placed in the center of the FPU. In block 402, the frontend is placed directly above the aligner. In block 403, the multiplier is placed directly below the frontend and directly next to the aligner. In block 404, the adder is placed directly below the aligner and directly next to the multiplier. In block 405, the normalizer is placed directly above the adder. In block 406, the rounder is placed directly above the normalizer. A result of method 400 is that related element pairs are located close together, allowing for simplification of wiring in the FPU. Related element pairs include: frontend-multiplier; frontend-aligner; multiplier-adder; aligner-adder; adder-normalizer; normalizer-rounder; and rounder-frontend. Each related element pair may be connected by good wires in some embodiments. Also, I/O buses going to and from the aligner and multiplier may not cross other functional blocks.

Figure 5:
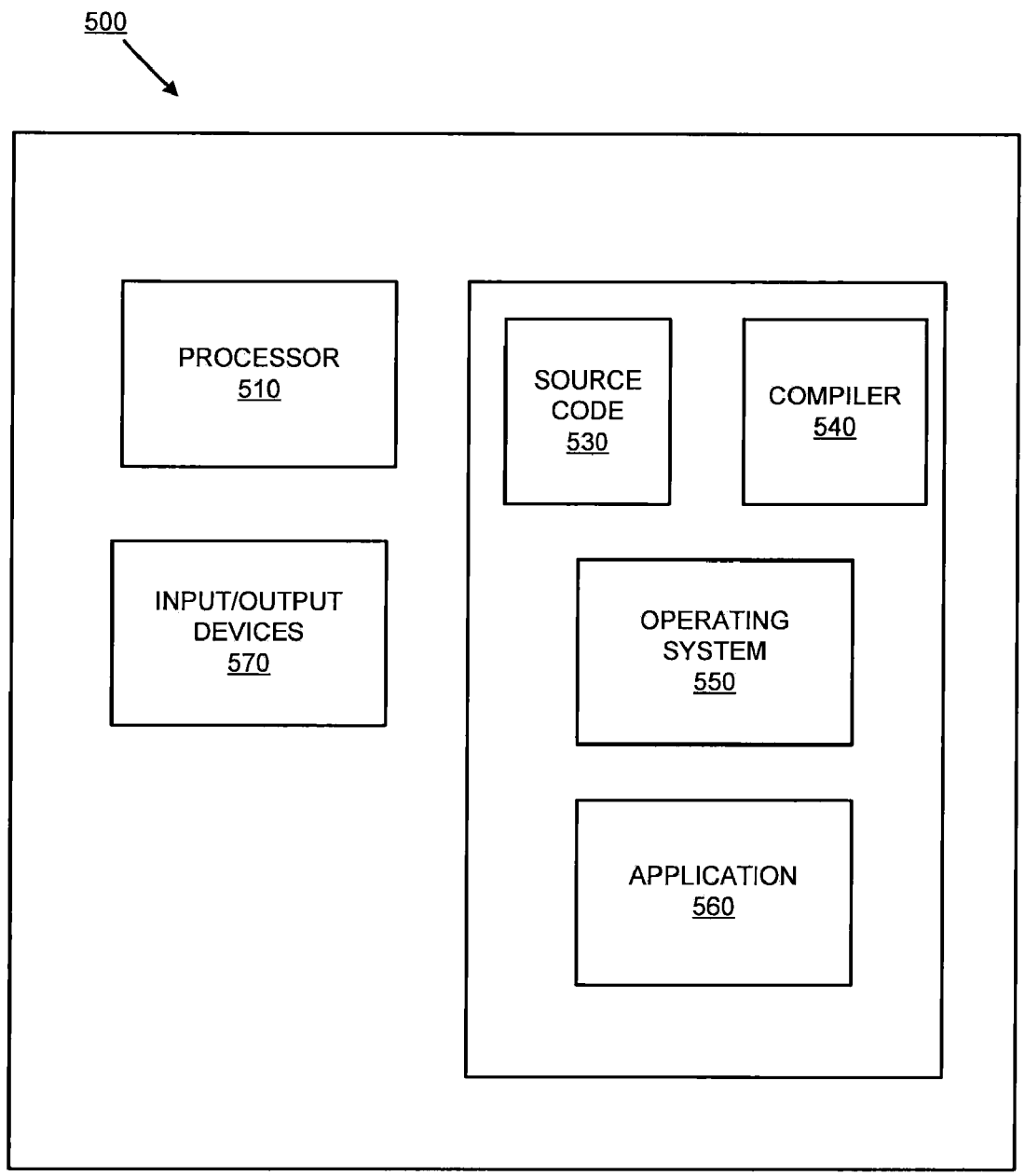
FIG. 5 illustrates a computer that may be used in conjunction with embodiments of a 3-stack floating point unit.

FIG. 5 illustrates an example of a computer 500 having capabilities, which may be utilized by exemplary embodiments. Various operations discussed above may also utilize the capabilities of the computer 500. One or more of the capabilities of the computer 500 may be incorporated in any element, module, application, and/or component discussed herein.

The computer 500 includes, but is not limited to, PCs, workstations, laptops, PDAs, palm devices, servers, storages, and the like. Generally, in terms of hardware architecture, the computer 500 may include one or more processors 510, memory 520, and one or more input and/or output (I/O) devices 570 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a data signal processor (DSP), or an auxiliary processor among several processors associated with the computer 500, and the processor 510 may be a semiconductor based microprocessor (in the form of a microchip) or a macroprocessor.

The memory 520 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 520 may incorporate electronic, magnetic, optical, and/or other types of storage media. Note that the memory 520 can have a distributed architecture, where various components are situated remote from one another, but can be accessed by the processor 510.

The software in the memory 520 may include one or more separate programs, each of which comprises an ordered listing of executable instructions for implementing logical functions. The software in the memory 520 includes a suitable operating system (O/S) 550, compiler 540, source code 530, and one or more applications 560 in accordance with exemplary embodiments. As illustrated, the application 560 comprises numerous functional components for implementing the features and operations of the exemplary embodiments. The application 560 of the computer 500 may represent various applications, computational units, logic, functional units, processes, operations, virtual entities, and/or modules in accordance with exemplary embodiments, but the application 560 is not meant to be a limitation.

The operating system 550 controls the execution of other computer programs, and provides scheduling, input-output control, file and data management, memory management, and communication control and related services. It is contemplated by the inventors that the application 560 for implementing exemplary embodiments may be applicable on all commercially available operating systems.

Application 560 may be a source program, executable program (object code), script, or any other entity comprising a set of instructions to be performed. When a source program, then the program is usually translated via a compiler (such as the compiler 540), assembler, interpreter, or the like, which may or may not be included within the memory 520, so as to operate properly in connection with the O/S 550. Furthermore, the application 560 can be written as (a) an object oriented programming language, which has classes of data and methods, or (b) a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 570 may include input devices such as, for example but not limited to, a mouse, keyboard, scanner, microphone, camera, etc. Furthermore, the I/O devices 570 may also include output devices, for example but not limited to a printer, display, etc. One or more of I/O devices 570 may communicate with input 310b and output 310a of FIG. 3. Finally, the I/O devices 570 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 570 also include components for communicating over various networks, such as the Internet or intranet.

If the computer 500 is a PC, workstation, intelligent device or the like, the software in the memory 520 may further include a basic input output system (BIOS) (omitted for simplicity). The BIOS is a set of essential software routines that initialize and test hardware at startup, start the O/S 550, and support the transfer of data among the hardware devices. The BIOS is stored in some type of read-only-memory, such as ROM, PROM, EPROM, EEPROM or the like, so that the BIOS can be executed when the computer 100 is activated.

When the computer 500 is in operation, the processor 510 is configured to execute software stored within the memory 520, to communicate data to and from the memory 520, and to generally control operations of the computer 500 pursuant to the software. The application 560 and the O/S 150 are read, in whole or in part, by the processor 510, perhaps buffered within the processor 510, and then executed.

When the application 560 is implemented in software it should be noted that the application 560 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 560 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

More specific examples (a nonexhaustive list) of the computer-readable medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 560 is implemented in hardware, the application 560 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The technical effects and benefits of exemplary embodiments include a more compact FPU floorplan design, lower power consumption, and an increase in the speed of the FPU.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:
1. A floating point unit comprising:
an aligner located in the center of the floating point unit;
a frontend located directly above the aligner;
a multiplier located directly below the frontend and next to the aligner;

an adder located directly next to the multiplier and directly below the aligner;

a normalizer located directly above the adder; and a rounder located directly above the normalizer.

2. The floating point unit of claim 1, wherein the height of the multiplier is approximately the sum of the height of the aligner and the height of the adder.

3. The floating point unit of claim 1, further comprising an exponent and control block located between the rounder and the frontend.

4. The floating point unit of claim 1, wherein the rounder and the frontend are vertically aligned.

5. The floating point unit of claim 1, wherein the connection between the multiplier and the adder does not cross over the aligner.

6. The floating point unit of claim 1, wherein the height of the adder is approximately the sum of the width of the aligner and the width of the normalizer.

7. The floating point unit of claim 1, wherein the aligner is located directly next to the normalizer.

8. The floating point unit of claim 1, wherein the aligner is located between the multiplier and the normalizer.

* * * * *